(12) United States Patent
Yoshimatsu et al.

(10) Patent No.: US 6,509,629 B2
(45) Date of Patent: Jan. 21, 2003

(54) POWER MODULE

(75) Inventors: Naoki Yoshimatsu, Tokyo (JP);
Takanobu Yoshida, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 5 days.

(21) Appl. No.: 09/759,252

(22) Filed: Jan. 16, 2001

(65) Prior Publication Data
US 2002/0024120 A1 Feb. 28, 2002

(30) Foreign Application Priority Data
Aug. 24, 2000 (JP) .................................... 2000-253900

(51) Int. Cl.[7] .......................................... H01L 23/552
(52) U.S. Cl. ...................... 257/660; 257/659; 257/691; 257/698; 257/724; 257/731
(58) Field of Search ................. 257/659, 660, 257/686, 690, 691, 698, 704, 706, 723, 724, 730, 731

(56) References Cited
U.S. PATENT DOCUMENTS

| | | | |
|---|---|---|---|
| 4,557,225 A | * 12/1985 | Sagues et al. | 123/41.31 |
| 5,208,732 A | * 5/1993 | Baudouin et al. | 361/704 |
| 5,444,297 A | * 8/1995 | Oshima et al. | 257/691 |
| 5,459,348 A | * 10/1995 | Smith | 257/659 |
| 5,500,789 A | * 3/1996 | Miller et al. | 361/816 |
| 5,589,711 A | * 12/1996 | Sano et al. | 257/718 |
| 5,650,659 A | * 7/1997 | Mostafazadeh et al. | 257/660 |
| 5,821,604 A | * 10/1998 | Egawa | 257/659 |
| 5,866,943 A | * 2/1999 | Mertol | 257/712 |
| 5,930,115 A | * 7/1999 | Tracy et al. | 361/704 |
| 6,075,700 A | * 6/2000 | Houghton et al. | 361/704 |
| 6,092,281 A | * 7/2000 | Glenn | 29/841 |
| 6,163,474 A | * 12/2000 | Prasanna et al. | 365/52 |
| 6,297,551 B1 | * 10/2001 | Dudderar et al. | 257/723 |

FOREIGN PATENT DOCUMENTS

| | | | | |
|---|---|---|---|---|
| EP | 0 481 806 A1 | 4/1992 | | |
| EP | 0 506 090 | * 9/1992 | ......... | H01L/23/552 |
| JP | 4-04-216652 | * 8/1992 | ................. | 257/660 |
| JP | 5-259373 | 10/1993 | | |
| JP | 5-299876 | 11/1993 | | |
| JP | 6-45518 | 2/1994 | | |
| JP | 6-283638 | 10/1994 | | |

* cited by examiner

*Primary Examiner*—George Eckert
(74) *Attorney, Agent, or Firm*—Ledig, Voit & Mayer, Ltd.

(57) ABSTRACT

A control substrate is covered by an electromagnetic shielding member connected to a conductive base plate on which a power insulating substrate is placed. A conductive connecting member through which the electromagnetic shielding member and the conductive base plate are electrically connected to each other is inserted into a case. The control substrate and the electromagnetic shielding member are supported by the conductive connecting member.

5 Claims, 3 Drawing Sheets

POWER MODULE

BACKGROUND OF THE INVENTION

1. Field of the Invention

The present invention relates to a power module in which a power switching semiconductor device is mounted on a circuit pattern formed on a front principal face of a power insulating substrate, a rear principal face of the power insulating substrate being bonded to an upper principal face of a base plate, an outer peripheral edge of the base plate being fixed to an open edge of one end of a cylindrical case, and a control substrate on which control components including a control semiconductor device for controlling the power switching semiconductor device are mounted, is disposed in the case while being opposed to the power insulating substrate with a gap therebetween, and more particularly to an improvement of electromagnetic shielding on such a control substrate.

2. Description of the Related Art

As a conventional power module of this kind, a power module for an automobile will be described with reference to FIG. 4.

Referring to the figure, 1 denotes a cylindrical case which has an opening at each of its ends, and 2 denotes a conductive base plate which is a copper plate, and which is fixed at an outer peripheral edge to the lower end of the case 1 so as to close the lower end opening of the case 1. The reference numeral 3 denotes a power insulating substrate in which a circuit pattern 3a is formed on the front principal face, and the rear principal face is bonded to the upper principal face of the conductive base plate 2, 4 denotes a power switching semiconductor device which is mounted on the circuit pattern 3a, and 5 denotes external power terminals which are inserted into the case 1, and one end of each of which is formed as an exposed face 5a on the inner side of a lower end portion of the case 1. The reference numeral 6 denotes bonding wires through which electrodes (not shown) of the power switching semiconductor device 4 are electrically connected, for example, via the circuit pattern 3a to the exposed faces 5a of the external power terminals 5.

The reference numeral 7 denotes a control substrate in which control components 8, such as a control semiconductor device for controlling the power switching semiconductor device 4, are mounted on the front principal face of the control substrate 7. An electromagnetic shielding plate 9 is integral with the rear principal face so as to shield the control components 8 from electromagnetic waves emitted from the power switching semiconductor device 4.

The reference numeral 10 denotes relay terminals through which a control signal from the control substrate 7 is transmitted to the power switching semiconductor device 4.

The reference numeral 11 denotes a wire harness comprising a grounding wire (not shown) through which the electromagnetic shielding plate 9 is electrically connected to a frame ground of an automobile, and wires (not shown) for input/output signals of the control substrate.

The reference numeral 12 denotes a gel-like resin which fills the case 1 so as to cover the front principal face of the power insulating substrate, the power switching semiconductor device 4, and the bonding wires 6, and 13 denotes a cover made of a resin which covers the other end opening of the case 1.

The reference numeral 14 denotes a heat sink which is attached to the lower principal face of the conductive base plate 2, and which is grounded.

Next, the operation of the thus configured power module of the conventional art will be described.

When a control signal which is supplied to the control substrate 7 through the wire harness 11 is turned on or off, the power switching semiconductor device 4 is turned on or off, so that the power which is supplied to a load through the external power terminals 5 is turned on and off, or, for example, PWM control is performed. A predetermined control signal is output through the wire harness 11.

When the power switching semiconductor device 4 is turned on and off, electromagnetic waves are generated. The electromagnetic waves are dissipated via the electromagnetic shielding plate 9 and the wire harness 11 to the frame ground of the automobile. Therefore, it is possible to prevent the control components 8 such as the control semiconductor device mounted on the control substrate 7, from being caused to malfunction by the electromagnetic waves generated by the power switching semiconductor device 4.

Unlike on the rear principal face of the control substrate 7, however, an electromagnetic shielding plate cannot be disposed on the front principal face of the control substrate 7 because the control components 8 are mounted on the front principal face. As a result, the control components 8, such as the control semiconductor device mounted on the control substrate 7, are sometimes caused to malfunction by external electromagnetic waves.

Since the wire harness 11 is used, the inductance of the wire harness 11 reduces the effect of the electromagnetic shielding against electromagnetic waves, whereby the control components 8, such as the control semiconductor device mounted on the control substrate 7, are sometimes caused to malfunction.

In a conventional art power module of this kind, control components, such as a control semiconductor device mounted on a control substrate, can be prevented from being caused to malfunction by electromagnetic waves generated by an incorporated power switching semiconductor device. However, such control components are not shielded from external electromagnetic waves, and hence there is a problem in that the control components sometimes malfunction and therefore the reliability of the power module is low.

SUMMARY OF THE INVENTION

The invention has been conducted in view of the above-discussed circumstances of the conventional art. It is an object of the invention to provide a power module which is not caused to malfunction by electromagnetic waves, and which therefore has high reliability.

It is another object of the invention to provide a power module which is not caused to malfunction by external electromagnetic waves, which therefore has high reliability, and which is compact in size.

It is a further object of the invention to provide an economical power module which is not caused to malfunction by external electromagnetic waves, and which therefore has high reliability.

The power module of the invention is a power module characterized in that an electromagnetic shielding member for shielding a control substrate from electromagnetic waves is disposed in a case, and the electromagnetic shielding member is electrically connected to a conductive base plate.

Front and rear principal faces of the control substrate may be covered with the electromagnetic shielding member.

Control components may be mounted on both of front and rear principal faces of the control substrate.

The conductive base plate and the electromagnetic shielding member may be electrically connected to each other by a conductive connecting member which is rigid, and the control substrate and the electromagnetic shielding member may be supported by the conductive connecting member.

The conductive connecting member may be inserted into the case.

The control components may be mounted on a front principal face of the control substrate, and a plate-like electromagnetic shielding member is disposed integrally on a rear principal face of the control substrate which is opposed to a power insulating substrate.

DETAILED DESCRIPTION OF THE PREFERRED EMBODIMENTS

Embodiment 1

Figure 1:
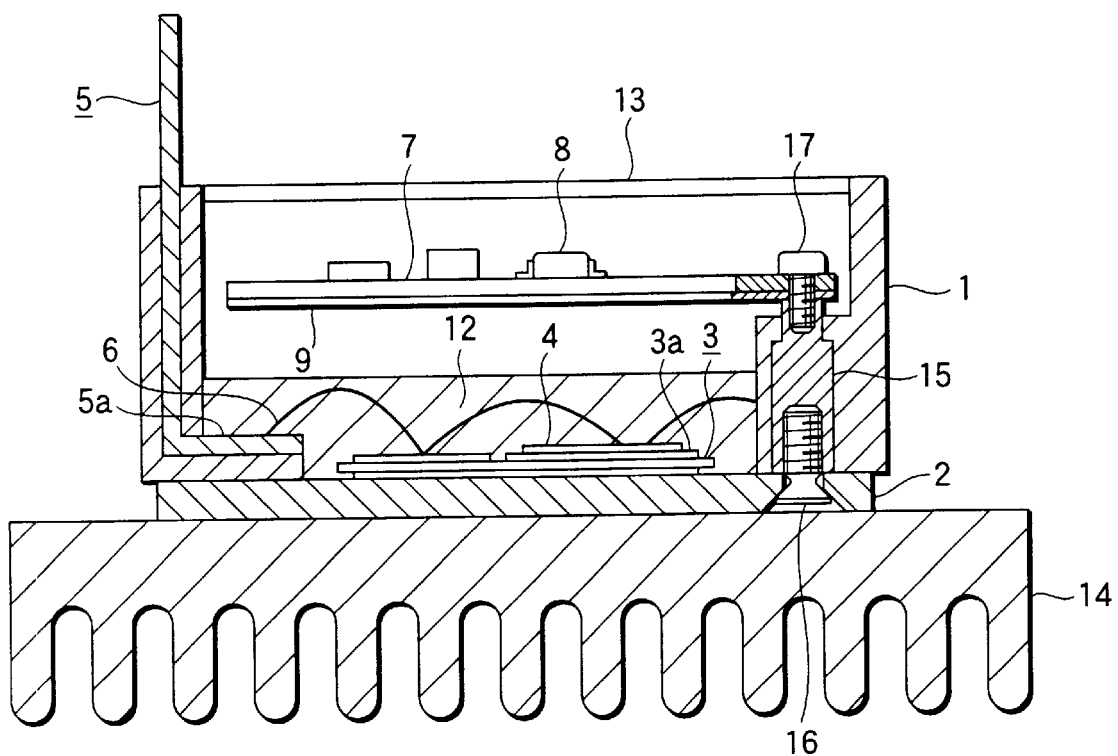
FIG. 1 is a longitudinal section view showing Embodiment 1 of the invention.
Figure 4:
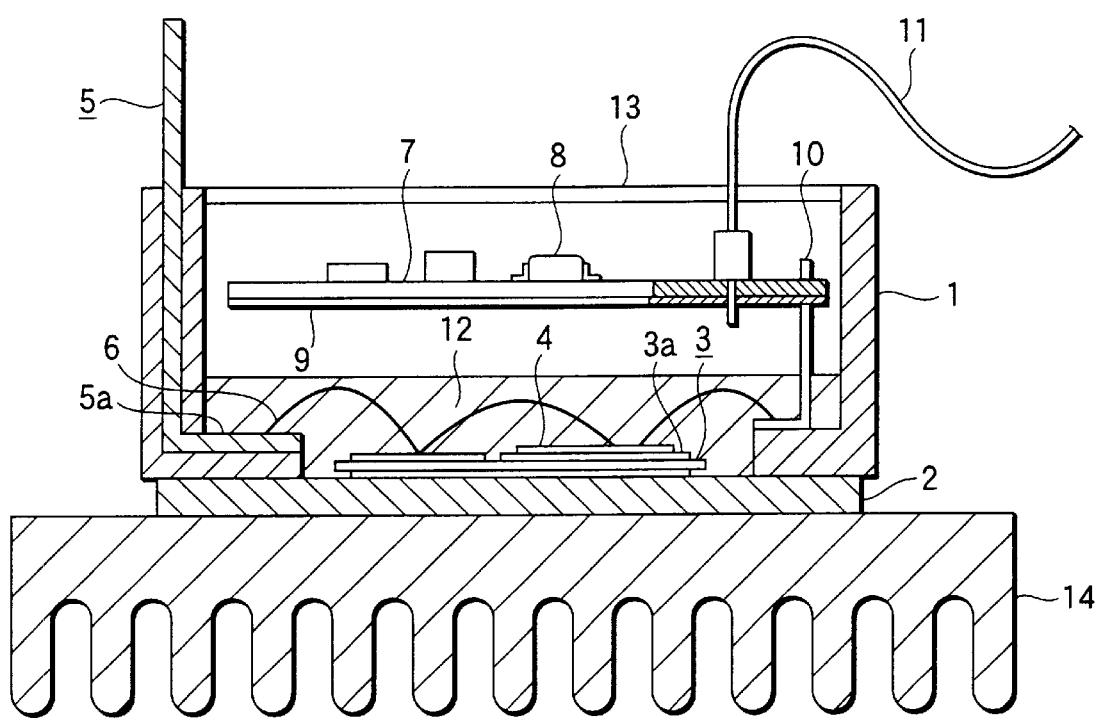
FIG. 4 is a longitudinal section view of a conventional power module.

Embodiment 1 of the invention will be described with reference to FIG. 1. Referring to the figure, 15 denotes a conductive connecting member which is inserted into the case 1, and through which the conductive base plate 2 and the electromagnetic shielding plate 9 are electrically connected to each other. By screwing a screw 16 into a female thread which is formed in a lower end portion of the conductive connecting member, the conductive connecting member 15 is connected electrically and mechanically to the conductive base plate 2, and, by screwing a screw 17 into a female thread which is formed in an upper end portion of the conductive connecting member 15 the electromagnetic shielding plate 9 is electrically connected to the conductive base plate 2 and the control substrate 7 is supported. The other components which denoted by the same reference numerals as those in FIG. 4 are configured in the same manner as the components denoted by the reference numerals, and hence their description is omitted.

In this configuration, electromagnetic waves which are emitted toward the control substrate 7 during a switching operation of the power switching semiconductor device 4 are dissipated to the heat sink 14 which is shielded by the electromagnetic shielding plate and grounded via the conductive connecting member 15. Therefore, the control components 8 such as the control semiconductor device mounted on the control substrate 7 can be prevented from malfunctioning.

Unlike a conventional art power module, the structure in which the wire harness 11 is not used for connection with the frame ground is employed, and hence it is possible to eliminate the disadvantage that the effect of shield against electromagnetic waves is reduced by the inductance of the wire harness 11.

Embodiment 2

Figure 2:
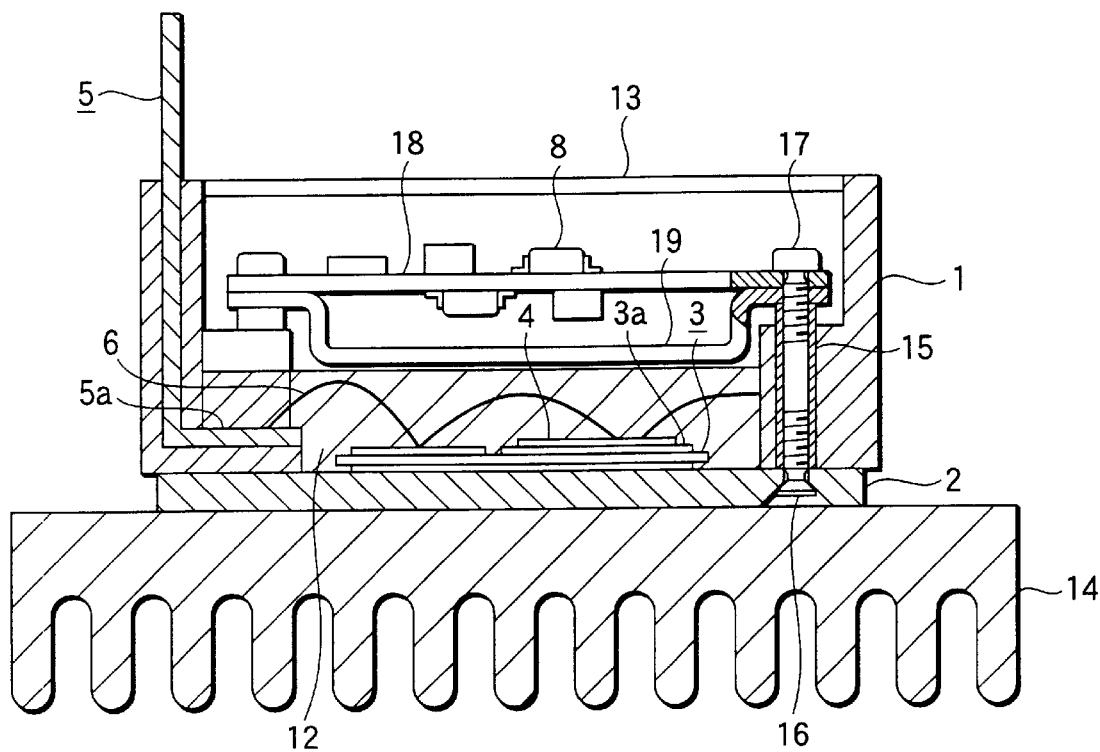
FIG. 2 is a longitudinal section view showing Embodiment 2 of the invention.

Embodiment 2 of the invention will be described with reference to FIG. 2. Referring to the figure, reference numeral 18 denotes a control substrate which corresponds to the control substrate 7 of Embodiment 1. The control components 8 are mounted on circuit patterns which are formed on-the front and rear principal faces of the control substrate 18, respectively.

Reference numeral 19 denotes a recessed conductive electromagnetic shielding member which is disposed so as to cover the:control components 8 mounted on the rear principal face of the control substrate 18. The shielding member is fixed together with the control substrate 18 to an upper end of the conductive connecting member 15 by the screw 17, and electrically connected to the conductive base plate 2 and the heat sink 14 via the screw 17, the conductive connecting member 15, and the screw 16.

As a power module, Embodiment 2 which is configured as described above operates in the same manner as Embodiment 1, and hence description of the operation is omitted. Electromagnetic waves which are emitted toward the control substrate 18 from the power switching semiconductor device 4 are dissipated to the heat sink 14 which is grounded via the conductive electromagnetic shielding member 19, the screw 17, the conductive connecting member 15, the screw 16, and the conductive base plate 2. In the same manner as Embodiment 1, therefore, the control components 8 such as the control semiconductor device which are mounted on the control substrate 18 ca n be prevented from malfunctioning.

In Embodiment 2, since the control components 8 are mounted on both of the front and rear principal faces of the control substrate 18, the dimensions of the control substrate 18 in a plan view can be reduced, with the result that miniaturization of the power module and reduction of the production cost can be attained.:

Embodiment 3

Figure 3:
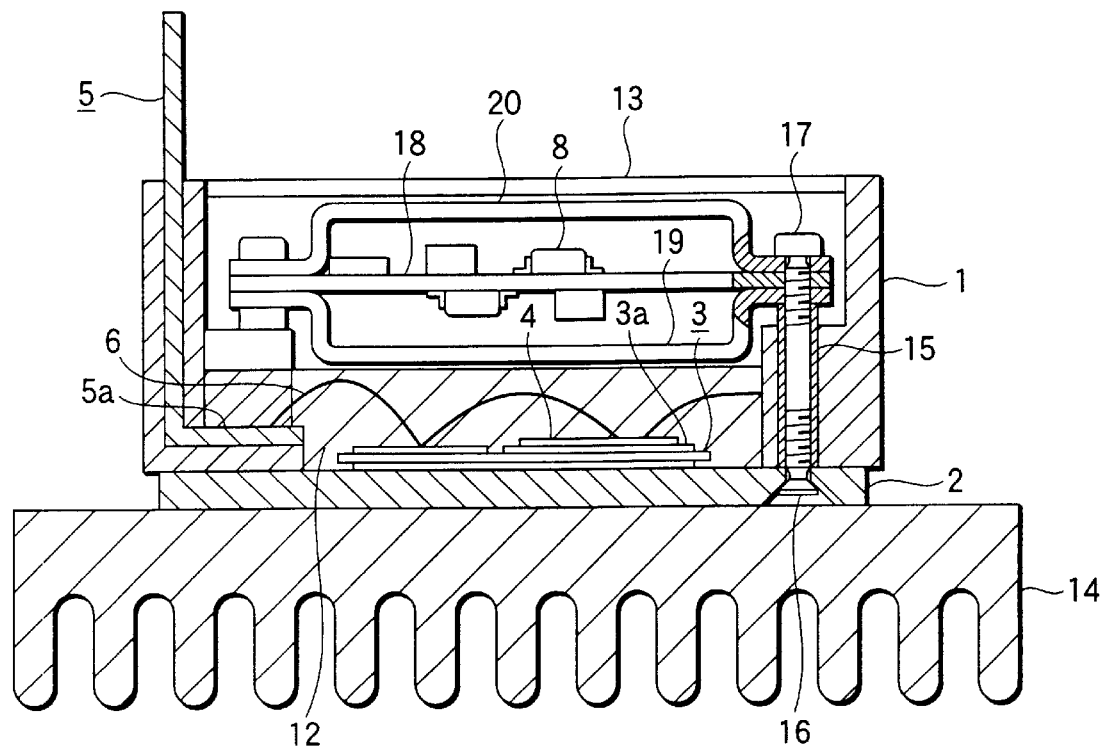
FIG. 3 is a longitudinal section view showing Embodiment 3 of the invention.

Embodiment 3 of the invention will be described with reference.to FIG. 3. Referring to the figure, reference numeral 20 denotes a recessed conductive electromagnetic shielding member which is disposed so as to cover the control components 8 mounted on the front principal face of the control substrate 18, in addition to the configuration of Embodiment 2. The electromagnetic shielding member 20 is fixed together with the control substrate 18 to the upper end of the conductive connecting member 15 by the screw 17, and electrically connected to the conductive base plate 2 and the heat sink 14 via the screw 17, the conductive connecting member 15, and the screw 16.

As a power module, Embodiment 3 which is configured as described above operates in the same manner as Embodiments 1 and 2, and hence description of the operation is omitted. Electromagnetic waves which are emitted toward the control substrate 18 from the power switching semiconductor device 4 are dissipated to the heat sink 14 which is grounded via the electromagnetic shielding member 19, the screw 17, the conductive connecting member 15, the screw 16, and the conductive base plate 2. Furthermore, external electromagnetic waves which are emitted toward the front principal face of the control substrate 18 are dissipated to the heat sink 14 which is grounded via the electromagnetic shielding member 20, the screw 17, the conductive connecting member 15, the screw 16, and the conductive base plate 2. Therefore, the control components 8 such as the control semiconductor device which are mounted on the control substrate 18 can be prevented from malfunctioning.

In Embodiment 3, since the control components 8 are mounted on both of the front and rear principal faces of the control substrate 18, a dimensions of the control substrate 18 in a plan view can be reduced, with the result that miniaturization of the power module and reduction of the production cost can be attained in the same manner as Embodiment 2. Even when the control components 8 are mounted on both the principal faces of the control substrate 18, the disposition of the electromagnetic shielding member 20 enables the control components 8 to be shielded from electromagnetic waves.

In Embodiments 1 to 3, the structure in which the electromagnetic shielding member 9, 19, or 20 is electrically connected to the conductive base plate 2 via the conductive connecting member 15, the screws 16, and 17, has been exemplarily described. It is a matter of course that the invention is not restricted to this structure.

The invention which is configured as described above can attain the following effects.

According to the first aspect of the invention, a power switching semiconductor device is mounted on a circuit pattern formed on a front principal face of a power insulating substrate, a rear front face of the power insulating substrate being bonded to an upper principal face of a conductive base plate, an outer peripheral edge of the conductive base plate being fixed to an open edge of one end of a cylindrical case, and a control substrate on which control components including a control semiconductor device for controlling the power switching semiconductor device are mounted is disposed in the case while being opposed to the power insulating substrate with forming a gap therebetween, wherein an electromagnetic shielding member for shielding the control substrate from electromagnetic waves is disposed, and the electromagnetic shielding member is electrically connected to the conductive base plate. Therefore, the invention attains effects that the control components mounted on the control substrate can be prevented from being caused to malfunction by electromagnetic waves generated by the power switching semiconductor device, and also that the problem in that, in a conventional art power module using a wire harness, the inductance of the wire harness reduces the effect of electromagnetic shield against electromagnetic waves can be solved.

According to the second aspect of the invention, the front and rear principal faces of the control substrate are covered with the electromagnetic shielding member. Therefore, the invention attains an effect that a power module is provided in which internal components can be shielded not only from electromagnetic waves generated by the power switching semiconductor device, i.e., internal noises, but also from electromagnetic waves emitted toward the front principal face of the control substrate, i.e., external noises.

According to the third aspect of the invention, control components are mounted on both of front and rear principal faces of the control substrate. Therefore, the invention attains an effect that the area of the principal face of the control substrate can be reduced, with the result that the power module can be miniaturized.

According to the fourth aspect of the invention, the conductive base plate and the electromagnetic shielding member are electrically connected to each other by a conductive connecting member which is rigid, and the control substrate and the electromagnetic shielding member are supported by the conductive connecting member. Therefore, the invention attains an effect that a power module is provided in which the structure of connecting the conductive base plate and the electromagnetic shielding member with each other and that of supporting the control substrate are simplified, and the assembling property, i.e., the productivity is excellent, and which is therefore economical.

According to the fifth aspect of the invention, the conductive connecting member is inserted into the case. Therefore, the invention attains an effect that a power module is provided in which it is not necessary to particularly support the conductive connecting member, and the assembling property, i.e., the productivity is excellent.

According to the sixth aspect of the invention, the control components are mounted on a front principal face of the control substrate, and a plate-like electromagnetic shielding member is disposed integrally on a rear principal face of the control substrate which is opposed to the power insulating substrate. Therefore, the invention attains an effect that a space in a thickness direction which is occupied by the control substrate and the control components mounted the control substrate can be reduced, with the result that the module can be thinned.

What is claimed is:

1. A power module comprising:
    a cylindrical case having an open edge at one end,
    a conductive base plate having an outer peripheral edge fixed to the open edge of the cylindrical case;
    an insulating substrate having a front face including a circuit pattern and a rear face connected to an upper face of the conductive base plate;
    a switching semiconductor device mounted on the circuit pattern of the insulating substrate;
    a control substrate having a front face and a rear face, the control substrate being disposed in the cylindrical case so that the rear face of the control substrate is opposite and spaced from the power insulating substrate by a gap;
    a control component for controlling the switching semiconductor device, the control component being mounted on the control substrate;
    a shielding member shielding the control substrate from electromagnetic waves, the shielding member being electrically connected to the conductive base plate; and
    a rigid conductive connecting member electrically connecting the conductive base plate to the shielding member and supporting the control substrate and the shielding member.

2. The power module according to claim 1, wherein the front and rear faces of the control substrate are covered by the shielding member.

3. The power module according to claim 1, wherein the control component is mounted on both the front and rear faces of the control substrate.

4. The power module according to claim 1, wherein the conductive connecting member is in the cylindrical case.

5. The power module according to claim 1, wherein the control component is mounted on the front face of the control substrate, and the shielding member has a plate shape and is integral with the rear face of the control substrate.

* * * * *